US006762615B2

(12) United States Patent
Lee et al.

(10) Patent No.: US 6,762,615 B2
(45) Date of Patent: Jul. 13, 2004

(54) PARALLEL TEST BOARD USED IN TESTING SEMICONDUCTOR MEMORY DEVICES

(75) Inventors: Man-Heung Lee, Chungcheongnam-do (KR); Chang-Ho Lee, Chungcheongnam-do (KR); Sang-Chul Yun, Chungcheongnam-do (KR); Si-Don Choi, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/094,561

(22) Filed: Mar. 8, 2002

(65) Prior Publication Data

US 2002/0125879 A1 Sep. 12, 2002

(30) Foreign Application Priority Data

Mar. 10, 2001 (KR) ........................................ 2001-12436
May 25, 2001 (KR) ........................................ 2001-28955

(51) Int. Cl.[7] .............................................. G01R 31/02
(52) U.S. Cl. ..................... 324/765; 324/158.1; 324/754; 365/201; 438/18
(58) Field of Search ................................ 324/765, 754, 324/155.1, 757, 761, 758, 72.5; 438/17, 18, 19; 257/48; 365/201; 714/719

(56) References Cited

U.S. PATENT DOCUMENTS

| | | | | |
|---|---|---|---|---|
| 4,196,386 A | * | 4/1980 | Phelps ......................... | 714/734 |
| 5,097,213 A | * | 3/1992 | Hunting et al. .............. | 324/538 |
| 5,200,885 A | * | 4/1993 | Hamilton et al. ............ | 361/785 |
| 5,644,707 A | * | 7/1997 | Chen ............................ | 714/57 |
| 5,646,522 A | * | 7/1997 | Etemadpour et al. ..... | 324/158.1 |
| 5,793,218 A | * | 8/1998 | Oster et al. .................. | 324/754 |
| 6,414,505 B1 | * | 7/2002 | Stauffer et al. ............. | 324/761 |
| 6,492,803 B2 | * | 12/2002 | Bell et al. ................. | 324/158.1 |

* cited by examiner

*Primary Examiner*—Kamand Cuneo
*Assistant Examiner*—Jimmy Nguyen
(74) *Attorney, Agent, or Firm*—Marger Johnson & McCollom, P.C.

(57) ABSTRACT

A parallel test board preferably includes a plurality of serial slots connected to a motherboard and a number of parallel slots connected to the motherboard in parallel with each other. The motherboard provides an actual operational environment for devices under test (DUTs). DUTs are mounted in the slots. Using a plurality of serial slots, distorted timings due to one serial slot (e.g., an extension slot) have an influence on the other serial slot (e.g., a reference slot), as well as on the parallel slots. In this manner, a timing margin failure occurring during a multi-bank operation can be effectively detected. The slots to which the DUTs are mounted preferably have a socket structure with a support block having contact pins arranged thereon. Each of the contact pins preferably has a module contact part configured to contact a tab of the DUT and a board contact part configured to contact conductive wiring patterns of an intermediation board. An elastic member is also preferably interposed between the support block and each of the module and the board contact parts. According to various aspects and embodiments of this invention, testing reliability is improved and the durability of the test board is significantly increased.

25 Claims, 7 Drawing Sheets

PARALLEL TEST BOARD USED IN TESTING SEMICONDUCTOR MEMORY DEVICES

This application claims priority from Korean Patent Application No. 2001-12436, filed Mar. 10, 2001 and Korean Patent Application No. 2001-28955, filed May 25, 2001, the contents of which are incorporated herein by reference in their entirety.

BACKGROUND OF THE INVENTION

1. Field of the Invention

This invention relates generally to testing semiconductor memory devices, and more particularly, to a parallel test board used to test semiconductor memory devices in their actual operating environment.

2. Description of the Related Art

After completing the manufacturing process (circuit design, wafer fabrication, and packaging), but before shipment, semiconductor IC devices are typically subjected to a number of tests, including an electrical performance test, to verify their performance and reliability.

The electrical performance test may include a DC test, an AC test, and a functional test. The DC test is used to verify the DC characteristics of an IC device by performing an open/short test and by measuring input currents, output voltages, power supply currents, and so forth. The AC test measures the timing of an IC device by applying input pulse signals to input terminals of the device. The AC test checks the operational characteristics of the device such as the input/output propagation delay time (or access time), the start and finish times of input and output signals, and so forth. In the functional test, test patterns generated from a pattern generator are transformed into pulse signals of a normal level. The pulse signals are then applied to a Device Under Test (DUT). The output signals from the DUT are compared to reference signals. In the case of memory devices, for instance, this test is used to verify read/write functions and to determine mutual interference of each of the memory cells during actual operation. Generally, a dynamic functional test, which combines the functional and AC tests, is performed.

In mass-production, it is impossible to test memory devices under all of the operating conditions they will encounter in actual use. Furthermore, as the functions of the memory devices improve and as the fabrication processes for the devices become more complicated, the number of possible defect patterns and hence the time required for testing the devices each increase. It is therefore becoming more difficult to test for every possible defect. Even if a semiconductor device passes the functional and reliability tests, however, it might still have a defect that cannot be detected until after it is assembled into an electronic apparatus (e.g., a personal computer). In some cases, the manufacturers of these apparatuses have their own test programs to screen for defective memory devices that are not applicable to conventional memory test equipment or that require too much time to perform. Performing these tests when the memory device is manufactured would consequently impose a heavy time and cost burden on semiconductor memory producers.

Considering these technical problems, memory manufacturers have tried to adapt memory device testing technology to reproduce circumstances representative of the actual environment in which the memory devices will be used. When testing memory products such as Dual Inline Memory Modules (DIMMs), for example, it is necessary to create a test condition similar or equivalent to the environment under which the memory modules will actually be operated, such as in a main memory device of a personal computer. In its actual operating environment, the input/output functions of the memory module may be affected by peripheral devices of the computer system (e.g., CPU, sound cards, graphic card, and BIOS). Accordingly, in order to optimize the actual testing conditions of the memory modules, a motherboard is used as a test board. Test technologies that test the DUTs by mounting them onto a motherboard are referred to as "actual operational tests."

FIG. 1 illustrates a conventional testing configuration for performing an actual operational test. As shown in FIG. 1, a parallel test board 20 is mounted onto a computer motherboard 10. FIG. 2 is a plan view of the parallel test board 20 shown in FIG. 1.

Referring to FIG. 1, the motherboard 10 includes various electronic components such as module slots 12. Absent the parallel test board 20, memory module devices 27 to be tested would be mounted in the module slots 12. A power terminal 13 is included to supply power to the motherboard 10. The motherboard 10 further includes PCI slots 14, IDE slots 15, an I/O slot 16 (configured to input/output data to and from storage devices such as HDDs), an output terminal 17 (configured to be connected to external output devices such as a display), and a BIOS having built-in firmware.

The foregoing components are generally mounted on the front side (i.e., the top surface in FIG. 1) of the motherboard 10, and are mutually or externally connected through soldering on the backside (i.e., the bottom surface in FIG. 1) of the board 10. The module slots 12 are further electrically interconnected to the parallel test board 20 through soldering on the backside of the motherboard 10. The parallel test board 20 is physically attached to the motherboard 10 using bolts attached through holes 19 of the motherboard 10 and holes 21 of the test board 20. Memory modules 27 are mounted in the plurality of slots 22, 23, 25.

Referring to FIG. 2, the conventional parallel test board 20 has three slots 22, 23, 25 that are configured to receive the memory modules to be tested. The use of a parallel test board 20 reduces the test time of the actual operational test. More particularly, the test time when memory devices are tested by directly mounting them in the module slots 12 of the motherboard 10 depends on the number of memory modules (i.e., the amount of memory). In that case, the memory module under test operates as a serial test module. As the memory capacity increases, therefore, the test time also increases. By providing a parallel test mode using the parallel test board 20, multiple (in this case, three) memory modules can be tested in the same amount of time.

The parallel test board 20 includes a reference slot 25 that is directly connected to each of module slots 12 on the motherboard 10. It also includes two parallel test slots 22 and 23 that have command signals connected in parallel with the reference slot 25. According to this arrangement, the memory modules mounted in the reference slot 25 are driven directly by the motherboard 10, while the memory modules mounted in the parallel test slots 22, 23 are operated in parallel with the modules in the reference slot 25. Accordingly, the memory modules loaded in the test slots 22, 23 are tested simultaneously with the memory module loaded in the reference slot 25. This results in a 67% reduction in test time.

Unfortunately, however, the actual environmental test using the parallel test board 20 suffers from several drawbacks. Among these disadvantages, a multi-bank operation failure cannot be detected using this test board arrangement. A multi-bank operation failure is when memory modules that have passed the conventional PC actual operational test fail when mounted in an actual PC motherboard. This failure can occur because two test slots 22, 23 are connected in parallel with the reference slot 25, which is directly connected to the motherboard 10 of the test device. In this configuration, the test results for the multiple modules in a conventional test are the same as if a single memory module is mounted to the motherboard. In other words, as long as at least one of the memory devices is not defective, no defect will appear. Defects in memory modules therefore cannot be accurately detected by the conventional actual operational test device and method in which a number of memory modules are mounted on the same system motherboard.

Additional drawbacks may also be present in the conventional actual operational test apparatus and method. For example, due to the connection structure of the motherboard 10 and parallel test board 20, the motherboard 10 suffers from poor durability. Specifically, in conventional testing systems, the memory slots are generally not demounted from the module slots once they have been mounted onto the motherboard, unless the motherboard itself is replaced or upgraded to increase the memory capacity. These module slots, however, have relatively poor durability and an operator must therefore pay special attention when mounting and demounting the memory modules. Typically, the conventional module slot has a life span of about 500 to 5,000 combined mountings and demountings. Accordingly, when mass-produced memory modules are tested using the conventional motherboard as a test board, the life span of the module slot is easily exceeded, leading to a test process failure.

SUMMARY OF THE INVENTION

It is an object of this invention to improve the reliability of a test process in which semiconductor devices are tested under their actual operating conditions.

Another purpose of this invention is to provide a parallel test board that can effectively detect a multi-bank operation failure.

Yet another purpose of this invention is to provide a parallel test board having an efficient mounting/demounting structure to enable testing of mass-produced memory module devices.

A parallel test board according to a preferred embodiment of the present invention comprises a plurality of serial slots (e.g., a reference slot and an extension slot) connected to a motherboard. A number of parallel slots of the test board are connected to the motherboard in parallel to each other and to the serial slots. Semiconductor memory devices to be tested are mounted in the serial and parallel slots. Using multiple serial slots, distorted timings due to one serial slot (e.g., the extension slot) influence the other serial slot (e.g., the reference slot) as well as the parallel slots. A timing margin failure occurring in multi-bank operation can therefore be effectively detected.

According to one aspect of the present invention, a parallel test board performs test sequences by connecting a plurality of semiconductor devices under test (DUTs) to a motherboard configured to provide an actual operational environment for the DUTs. The test board includes an intermediation board having conductive wiring patterns for electrically interconnecting the DUTs and the motherboard. A reference slot and an extension slot are each mounted to the intermediation board and configured to receive the DUTs. The reference slot and extension slot are preferably both directly electrically connected to the motherboard. A plurality of parallel slots are also mounted to the intermediation board and connected in parallel to the reference slot. The parallel slots are also configured to receive DUTs.

According to another aspect of the present invention, the reference slot, the extension slot and the plurality of parallel slots to which the DUTs are mounted have a socket structure. The socket structure includes a support block and contact pins. Each of the contact pins has a module contact part that corresponds to a tab of the DUTs and a board contact part that corresponds to conductive wiring patterns of the intermediation board. An elastic member is interposed between the support block and each of the module and the board contact parts. The board contact part of the contact pins may be formed to substantially wrap around the elastic member. The socket-structured slot is preferably bolt-coupled to the intermediation board. Connectors may be formed in the intermediation board for connection to the motherboard.

According to still another aspect of the present invention, the parallel test board is coupled to the backside of the motherboard, opposite the front surface. The electronic components of the motherboard (for example, a CPU, a BIOS, power terminals, slots for PCI and/or ISA interface cards, and output terminals) are preferably mounted to the front surface. The parallel test board can be connected to the motherboard through a pin-connection structure, for example.

BRIEF DESCRIPTION OF THE INVENTION

The foregoing and other objects, features, and advantages of the present invention will become more readily apparent through the following detailed description of preferred embodiments, made with reference to the accompanying drawings. It should be noted, however, that the illustrations are not necessarily drawn to scale, and that there may be other embodiments of this invention that are not specifically illustrated. In the accompanying drawings:

FIG. 6b is an exploded cross-sectional side view of a contact pin shown in FIG. 6a.

DETAILED DESCRIPTION OF PREFERRED EMBODIMENTS

Figure 1:
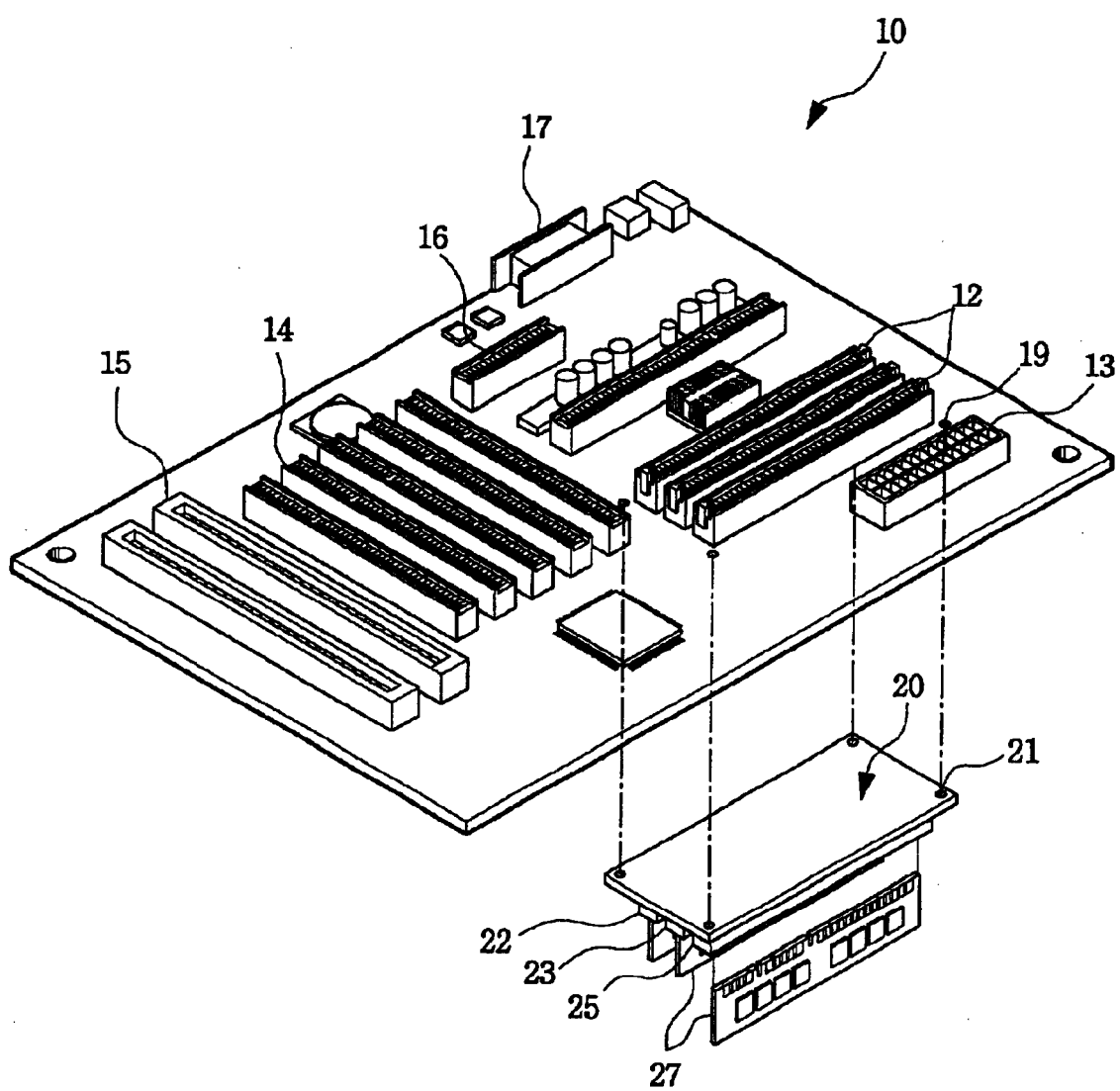
FIG. 1 is a perspective view of a conventional actual operational test apparatus.
Figure 2:
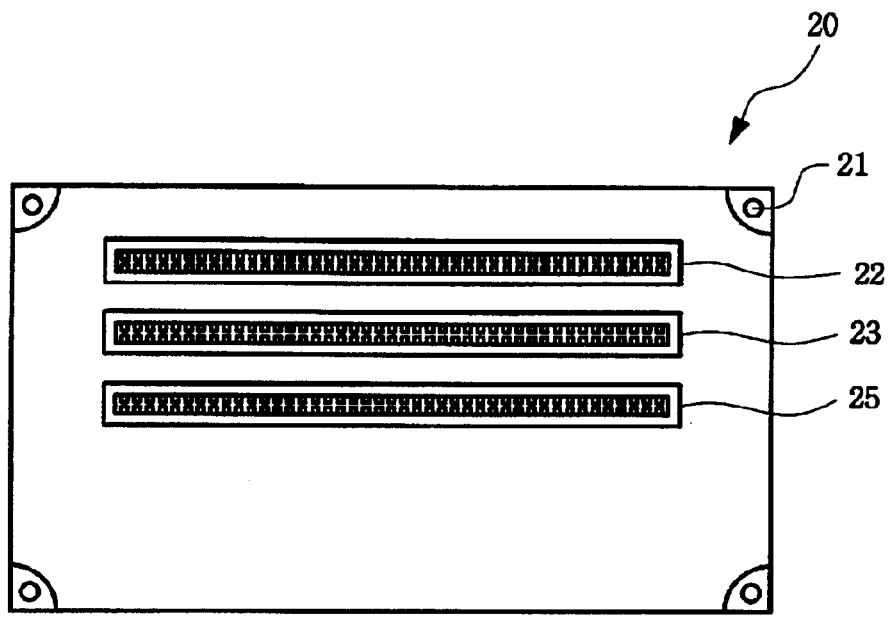
FIG. 2 is a bottom plan view of a parallel test board used in the conventional actual operational test apparatus shown in FIG. 1.
Figure 3:
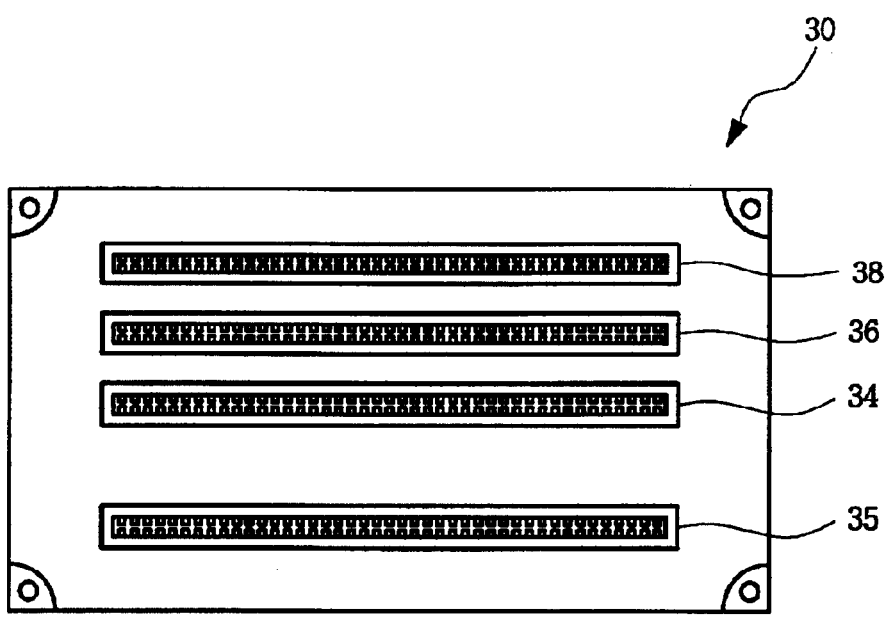
FIG. 3 is a bottom plan view of a parallel test board for testing semiconductor memory devices according to one embodiment of the present invention.

FIG. 3 is a bottom plan view of a parallel test board 30 for testing semiconductor memory devices according to one embodiment of the present invention. Referring to FIG. 3, the parallel test board 30 is provided with an extension slot 35, a reference slot 34, and a number of parallel test slots 36, 38 connected to the reference and extension slots 34, 35. Memory modules to be tested are mounted in each of the slots 34, 35, 36, 38. When the reference slot 34 operates (i.e., when read/write operations are performed to the memory module loaded in the reference slot 34), the identical read and write operations are performed to the parallel slots 36, 38. Timing distorted by the extension slot 35 affects the reference slot 34. The parallel slots 36, 38, which operate identically with the reference slot 34, are also affected.

In this manner, multi-bank operation failures, occurring when a multi-bank operation includes an external bank operation, can therefore be screened out. A multi-bank operation failure refers to fine timing margin failures occurring due to external and internal bank operations among module slots when a number of memory modules are mounted to a single motherboard. Each of the memory modules has preferably already passed a single loading test performed by mounting a single memory module to the motherboard before performing the multi-bank operation test.

Figure 4:
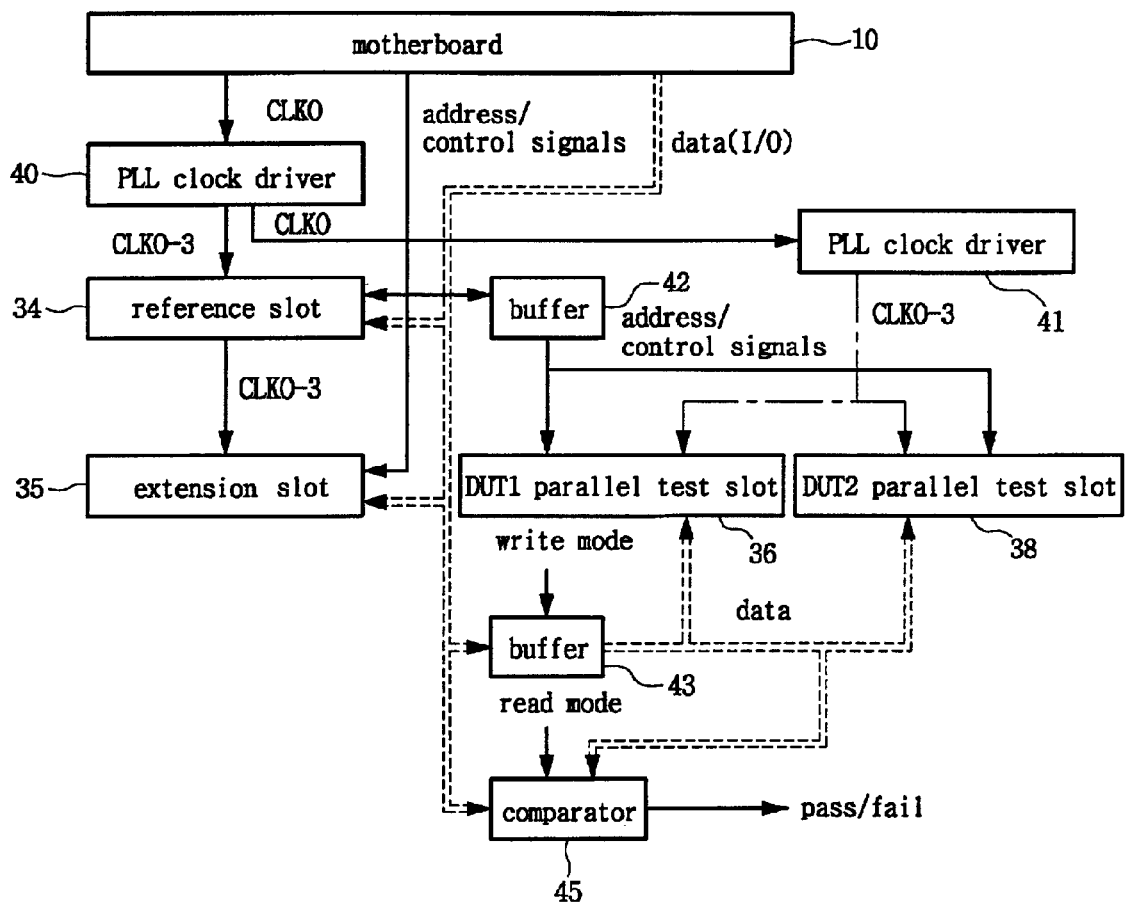
FIG. 4 is a block diagram illustrating a circuit configuration of a parallel test board for testing semiconductor memory devices according to one embodiment of the present invention.

FIG. 4 is a block diagram of a parallel test board circuit for testing memory devices according to another aspect of the present invention. Referring to FIG. 4, when a clock signal CLK0, supplied to the motherboard 100, is provided to a first PLL clock driver 40, output clocks CLK0–3 are input to a reference slot 34 and an extension slot 35. The output clocks CLK0–3 provide clock signals to memory devices loaded in those slots 34, 35. A clock signal CLK0, output from the first PLL clock driver 40, is also provided to a second PLL clock driver 41. The second PLL clock driver 41 provides clock signals CLK0–3 to a DUT1 parallel test slot 36 and a DUT2 parallel test slot 38.

Address and control signals from the motherboard 10 are preferably directly provided to the reference slot 34 and the extension slot 35, but are preferably indirectly provided to the parallel test slots 36, 38 via a buffer 42. Data Input/Output (I/O) signals are provided from the motherboard 10 to the reference slot 34 and the extension slot 35. The data I/O signals are input to the DUT1 and DUT2 parallel test slots 36, 38 through a buffer 43. Output data from the DUTs in slots 34, 35, 36, 38 are input to a comparator 45 and compared with a predetermined signal to determine a pass or fail status of each of the DUTs. The buffer 43 operates during a write mode of the memory device under test, while a buffer 45 operates during a read mode of the memory device.

When read/write operations are performed to memory devices loaded in the reference and extension slots 34, 35 by the motherboard 10, the same read/write operations are also performed to memory devices mounted to the DUT slots 36, 38, connected in parallel to the reference slot 34. For instance, if memory devices in the slots 34, 35, 36, 38 are 256MB DDR SDRAM of 4-bank double data rate 64MX4, an internal bank operation in each of the memory modules is performed by bank address selection signal BA0–BA1. In bank operation, if both BA0 and BA1 are "low" at read, write, row active, and precharge, bank A is selected.

Using the parallel test board 30, according to one embodiment of this invention, an external bank operation is performed to the reference and extension slots 34, 35. As a result, this operation has an influence on the parallel slots 36, 38. The external bank operation can be a correlated control of a CPU, for instance, in the motherboard 10 to a plurality of memory modules loaded in each of the slots. Accordingly, distorted timing by the extension slot 35, for example, produces an effect on the parallel slots 36, 38, as well as on the reference slot 34, such that a multi-bank operation failure can be effectively detected According to another embodiment of the present invention, a socket structure is used for the reference and extension slots of the parallel test board. In this way, mounting and demounting of the DUTs is simplified and the durability and life span of the socket can be improved. This embodiment will now be explained with reference to FIGS. 5 through 8.

Figure 5:
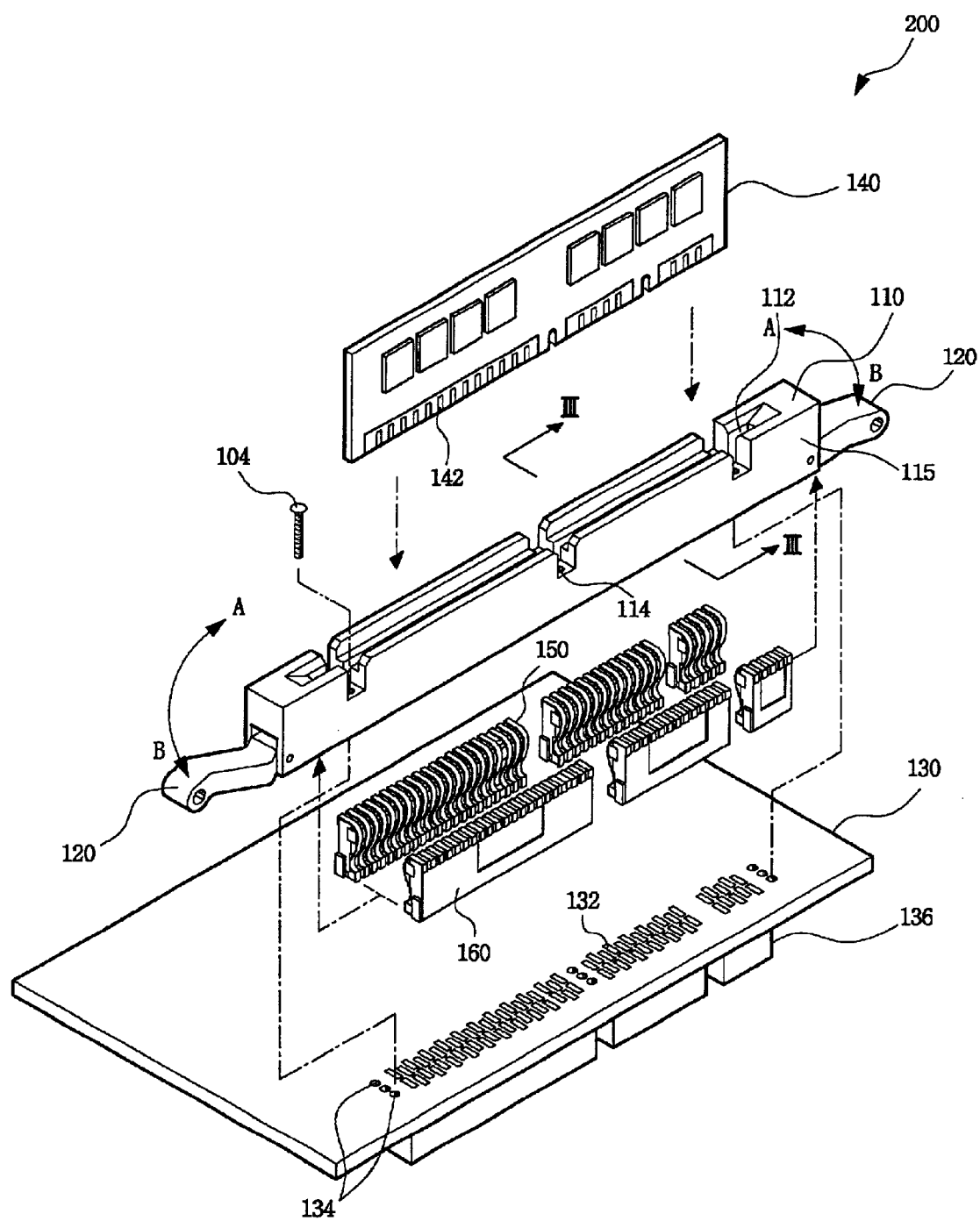
FIG. 5 is an exploded perspective view of a parallel test board according to another embodiment of the present invention.

FIG. 5 is an exploded perspective view of a parallel test board 200 having a socket structure according to this embodiment of the invention. Referring to FIG. 5, the parallel test board 200 includes a socket 110 and an intermediation board 130. The socket 110 has separation handles 120 at both ends. Memory modules 140 are inserted into the socket 110. The socket 110 further includes a housing 115, a number of support block pairs 160, and electrically conductive contact pins 150. The housing 115 is provided with an opening 112 to receive the memory module 140. The opening 112 has a structure that corresponds to a tab 142 of the memory module 140. The support blocks 160 are arranged within the housing 115, and the contact pins 150 are arranged substantially along the internal surfaces of the support block 160. The contact pins 150 are configured to contact the tab 142 of the memory module 140 when inserted into the opening 112.

The separation handles 120 can rotate about an axis within the housing 115 between positions "A" and "B". When the separation handles 120 are located in position "A", a memory module 140 located in the opening 112 of the socket 110 is locked in place, thereby preventing separation or removal of the memory module 140 from the socket 110. When the handles 120 are moved to location "B", however, a memory module 140 can be inserted into or removed from the opening 112 of the socket 110 with ease. The separation handles 120 are preferably configured to protrude from the socket body at both ends, so that the insertion into or the separation of the memory module 140 from the socket 110 using the handles 120 does not cause any damages or breakage to the separation handles 120.

The intermediation board 130 comprises conductive patterns 132, through holes 134 and connectors 136. Electronic circuitry formed on the intermediation board 130 permits the board 200 to function as a parallel test board. A detailed explanation of the circuitry is omitted, however, since it is within the level of ordinary skill in the art. The conductive patterns 132 are arranged in physical contact with the contact pins 150 to provide an electrical interconnection to the contact pins 150 of the socket 110.

The socket 110 is fixed to the intermediation board 130 by a coupling means. For instance, the intermediation board 130 and the socket 110 can be provided with matching through holes 134, 114, respectively. A bolt 104 can then be disposed through the through holes 134, 114 to connect the socket 110 to the board 130. Bolting the socket 110 to the intermediation board 130 improves the physical contact strength between the contact pins 150 and the conductive patterns 132 and enhances the reliability of the socket 110 by preventing the contact pins 150 from coming off the patterns 132. Other means of coupling are also contemplated. The slots can be configured with an irregular spacing therebetween.

The connectors 136 arranged on the bottom surface of the intermediation board 130 permit the parallel test board 200 to become coupled to the motherboard (not shown) by a pin contact method. In other words, pins connected to the module slots 12 of the motherboard are formed on the backside of the motherboard. These pins can be coupled to the slots 136 of the intermediation board 130.

Unlike the conventional test board, which is soldered onto the motherboard, the parallel test board 200 of this embodiment is pin-connected to the motherboard. In addition, the intermediation board 130 of the parallel board 200 can be coupled to the socket 110 by bolt connection, for example. Using these types of connection structures, the parallel test board 200 can be easily demounted from and remounted to the motherboard for replacement as needed, and separation of the socket 110 from the intermediation board 130 can be readily accomplished. As a result, sockets 110 that become defective during testing of mass-produced memory modules under actual operation conditions can be readily removed and replaced, providing improved efficiency and productivity of the test process. For example, the life span of the parallel test board 200 constructed according to the above-described embodiment of the present invention is about 150,000 mountings/demountings compared to the life span of about 500 to 5,000 mountings/demountings of the conventional parallel test board.

Figure 6A:
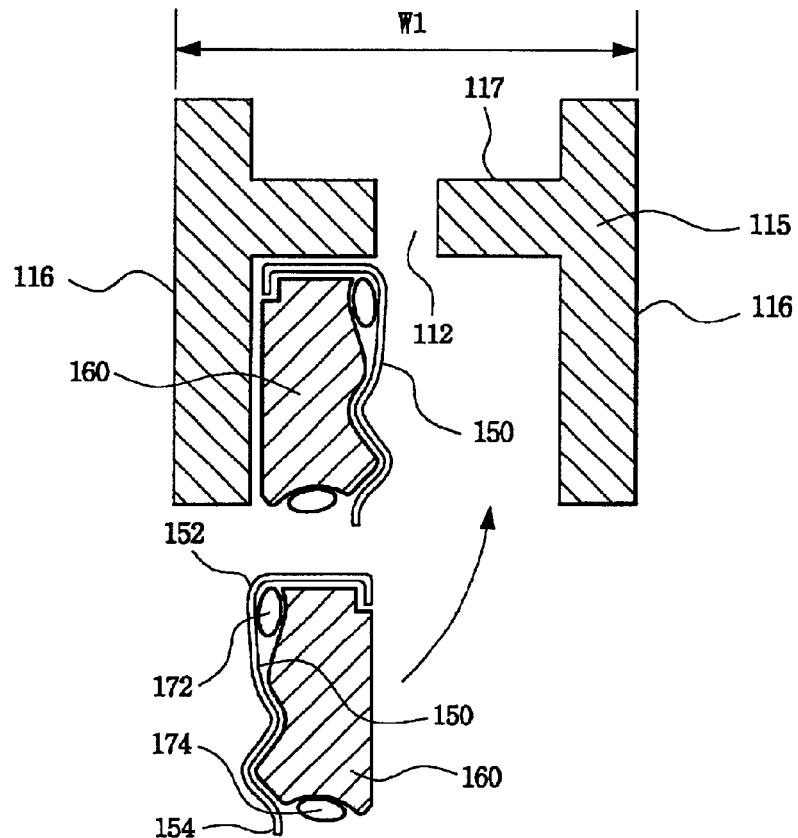
FIG. 6a is a cross-sectional side view of a socket and contact pins of the parallel test board of FIG. 5.
Figure 6B:
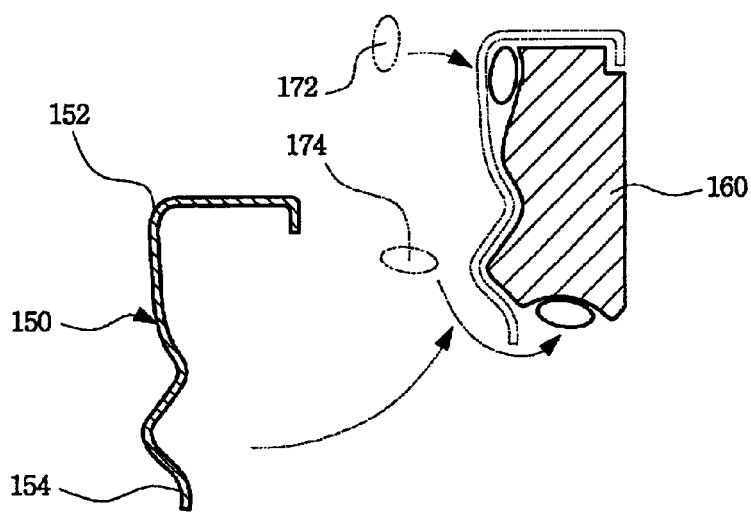

FIGS. 6a and 6b are cross sectional views of a socket and connector pin configuration, taken along line III—III in FIG. 5, and illustrate the socket structure, including the arrangement of contact pins 150 within the housing 115 of the parallel test board 200. Referring to FIGS. 6a and 6b, the housing 115 preferably has a cross-sectional shape similar to the capital letter "H" with two vertical members 116 and a horizontal member 117. The horizontal member 117 thereof includes a central opening 112. The opening 112 is configured to receive a memory module 140. An internal space having an opened bottom side is provided below the horizontal member 117 and between the horizontal members 116.

Support blocks 160 are disposed in the internal space of the housing 115 and can be attached to the inner surfaces of the horizontal members 116. Contact pins 150 are arranged along internal surfaces of the support blocks 160. Each contact pin 150 includes a module contact part 152, corresponding to the tab 142 of the memory module 140, and a board contact part 154, corresponding to conductive patterns 132 of the intermediation board 130.

Elastic members 172, 174, made of a material such as rubber, are preferably provided between the module contact part 152 of the contact pin 150 and the support block 160 as well as between the board contact part 154 of the contact pin 150 and the support block 160, respectively. The elastic members 172, 174 provide the contact pin 150 with a resilient property to improve the contact reliability between the tab 142 of the memory module 140 and the module contact part 152 and between the patterns 132 of the intermediation board 130 and the board contact part 154. The electrical reliability of the contact pin 150 is thereby enhanced.

Figure 7:
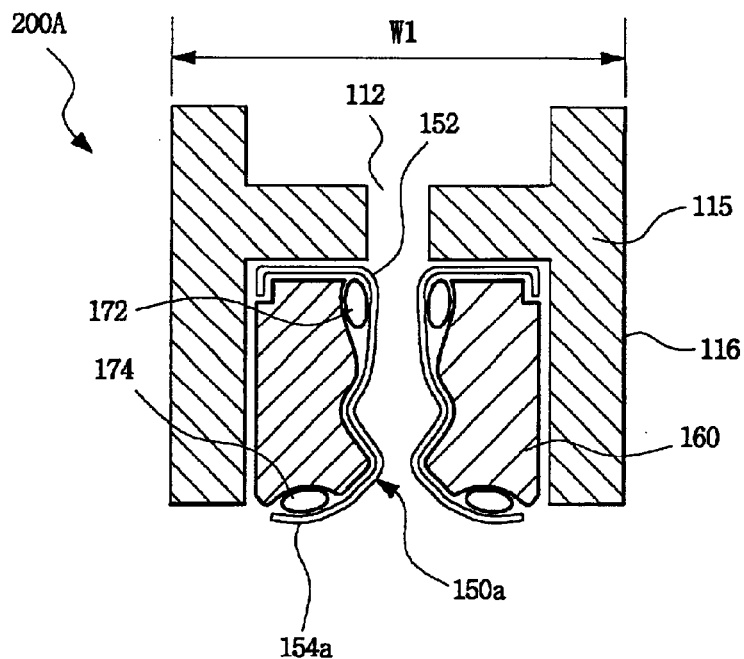
FIG. 7 is a cross sectional side view of a socket structure of a parallel test board according to yet another embodiment of the present invention.

FIG. 7 is also a cross-sectional view taken along line III—III in FIG. 5 showing another socket structure embodiment capable of use in a parallel test board constructed according to concepts of the present invention. Referring to FIG. 7, the embodiment shown has a socket structure 200a that is similar to that shown in FIGS. 6a and 6b. The shape of the contact pins 150a is different, however. The structure shown in FIG. 7 is preferable to that of FIGS. 6a and 6b because the board contact part 154a of the contact pin 150a is shaped to substantially wrap around its corresponding elastic member 174. This configuration enables the board contact part 154a of the contact pin 150a to surface-contact the conductive patterns 132 of the intermediation board 130 without damaging the patterns. Further, since the elastic member 174 is enveloped by the board contact part 154a, the elastic member 174 can be more securely retained between the board contact part 154a and the support block 160. The reliability of the connection between the contact part 154a and the patterns 132 on the intermediation board 132 can therefore be improved using this structure.

Figure 8A:
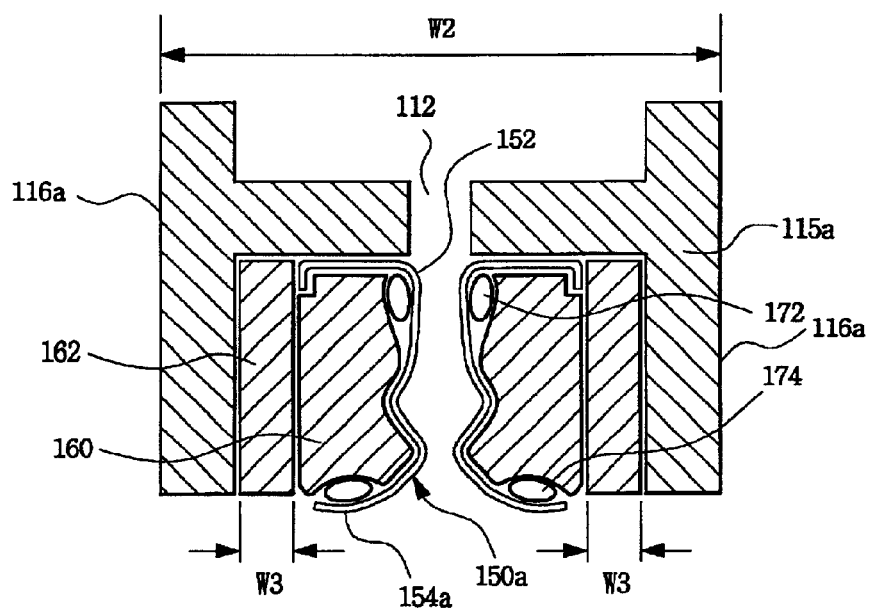
FIG. 8a is a cross-sectional side view of a socket structure having an enlarged width according to a still further embodiment of the present invention.
Figure 8B:
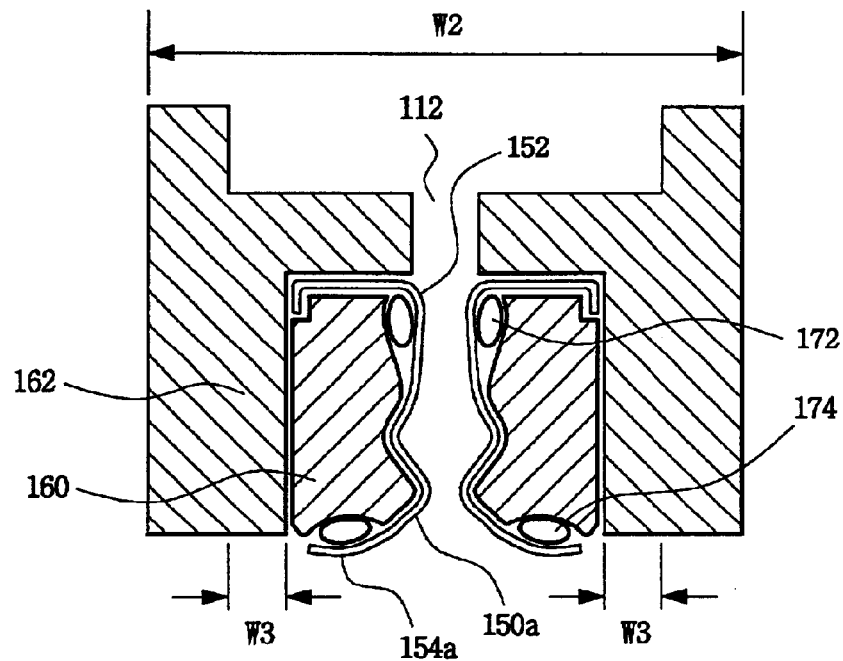
FIG. 8b is a cross-sectional side view of a socket structure having enlarged width according to an additional embodiment of the present invention.

FIGS. 8a and 8b are cross-sectional views of a socket structure having an enlarged width according to another aspect of the present invention. The sockets described above with reference to FIGS. 6a, 6b, and 7 have a width ('W1') of about 10 mm and a socket pitch of about 10.2 mm. The slots of these sockets may widen when repeatedly used in loading and unloading memory modules. The connection between the module and the socket, and more specifically the connection between the tab 142 of the module and the contact pins 150 of the socket may thereby become incomplete. To overcome this problem, the socket structures of FIGS. 8a and 8b have an enlarged width to increase the supporting strength of the socket components where the module devices are mounted. In this way, the widening of the slot and corresponding deterioration in the electrical connection can be prevented.

Referring specifically to FIG. 8a, the socket housing 115a may be provided with an enlarged width 'W2'. Supplemental blocks 162, having a width 'W3', can then be provided between the support blocks 160 and the vertical members 116a of the housing. Alternatively, as shown in FIG. 8b, the thickness of a lower portion of each of the vertical members 116b of the housing 115b can be increased by the width 'W3'.

The socket width 'W2' in these embodiments is preferably about 13.8 mm. Because the module supporting parts are more firmly supported by the additional width 'W3', the widening of the socket slot can be more effectively prevented. Accordingly, contact failure of the module device and the contact pins is prevented and the test process can be performed more reliably and efficiently.

When mass-produced memory modules are tested, it is desirable to automate both the operation of loading the DUTs into contact with a test device, such as a motherboard, and the operation of unloading tested devices from the motherboard. The loading and unloading operations are typically performed automatically by a handler system. The following description addresses the application of the parallel test boards as described previously to automatic loading and unloading processes of a handler system.

Figure 9:
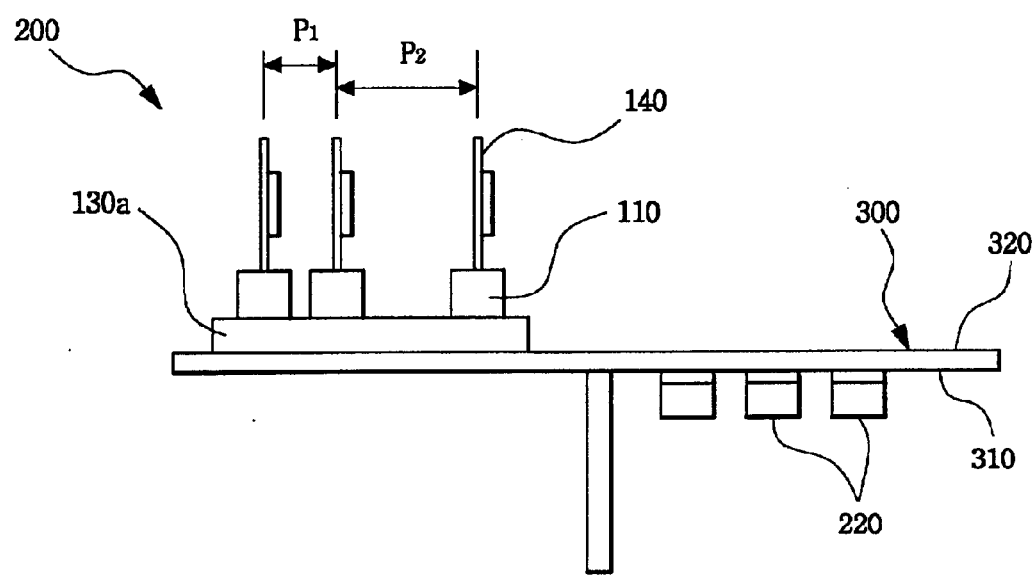
FIG. 9 is a side view of a parallel test board mounted to a motherboard according to another aspect of the present invention.

FIG. 9 is a cross-sectional view of a motherboard having a parallel test board constructed according to an embodiment of the present invention mounted thereto. In the following description, the front side (or front surface) 310 of the motherboard 300 refers to the surface where electronic components including CPUs, BIOS, power terminals, slots for PCI or ISA interface cards, and output terminals are mounted. The backside (or back surface) 320 of the motherboard 300 refers to the surface opposite the front side 310.

Referring to FIG. 9, the parallel test board 200 is preferably mounted to the backside 320 of the motherboard 300. One significant advantage of this backside mounting technique is the ease of mounting/demounting of modules 140 to and from the socket 110. Particularly, there are no obstacles in a module handling direction above the backside where the modules 140 are mounted and demounted. When the motherboard and parallel test board having this structure are used, therefore, an automatic loading/unloading apparatus such as a handler system can be employed in performing the actual operational tests on memory modules.

Referring still to FIG. 9, in yet another alternative embodiment of the present invention, rather than using individual intermediation boards for each of the sockets 110, a single common intermediation board 130a may be used. The common intermediation board 130a preferably has a multi-layered structure. The location at which the socket 110 is mounted on the common intermediation board 130a can be adjusted by changing the design of the circuit patterns. It is therefore advantageous to control the pitches P1 and P2 of the sockets (or housings) as needed. In this particular embodiment, the maximum value of the pitch is approximately 22.8 mm.

Several preferred embodiments of this invention have been described in the foregoing specification with respect to the accompanying drawings. Although specific terms have been employed in the descriptions thereof, these terms are used in a generic sense only and should not be considered as limiting the disclosed invention. Furthermore, additional variations and modifications to the invention as described will be readily apparent to those of ordinary skill in the art. All such variations and modifications should be considered to fall within the spirit and scope of this invention as set forth in the following claims.

What is claimed is:

1. A parallel test board configured to perform test sequences by connecting a plurality of semiconductor devices under test (DUTs) to a motherboard, said motherboard configured to provide an actual operational environment for the DUTs, said parallel test board comprising:
   an intermediation board having conductive wiring patterns and configured to electrically interconnect the DUTs to the motherboard;
   a reference slot mounted to the intermediation board and configured to receive one or more of the DUTs, wherein said reference slot is electrically connected to the motherboard;
   an extension slot mounted to the intermediation board and configured to receive one or more of the DUTs, wherein said extension slot is electrically connected to the motherboard and wherein the extension slot has the same configuration as the reference slot; and
   a plurality of parallel slots connected in parallel to the reference slot, wherein said parallel slots are mounted to the intermediation board and configured to receive one or more of the DUTs.

2. The parallel test board of claim 1, wherein the motherboard is configured to control the DUTs mounted in the reference and extension slots through an external bank operation.

3. The parallel test board of claim 1, wherein the motherboard includes a CPU that is configured to provide address signals, control signals, and data input signals to DUTs mounted in the reference and extension slots.

4. The parallel test board of claim 1, wherein the motherboard is configured to control read and write operations performed to DUTs mounted in the plurality of parallel slots at the same time read and write operations are performed to the DUTs mounted in the reference slot.

5. The parallel test board of claim 4, wherein the DUTs are memory modules and wherein the motherboard comprises:
   a first PLL clock driver configured to provide a clock signal to the memory modules mounted in the reference and extension slots; and
   a second PLL clock driver configured to receive an output signal from the first PLL clock driver and to provide a clock signal to the memory modules mounted in the plurality of parallel slots.

6. The parallel test board of claim 4, wherein the DUTs are memory modules and wherein the motherboard comprises a buffer configured to provide address signals and control signals to the memory modules mounted in the plurality of parallel slots.

7. The parallel test board of claim 4, wherein the DUTs are memory modules and wherein the motherboard comprises:
   a second buffer configured to provide data to the memory modules mounted in the plurality of parallel slots; and
   a comparator configured to compare output data from the memory module devices with reference data and to determine if the output data is identical to the reference data.

8. The parallel test board of claim 1, wherein the motherboard comprises a front side and a backside, said backside arranged opposite the front side, wherein the front side has electronic components mounted thereon, wherein said electronic components comprise a CPU, and wherein the parallel test board is mounted to the backside of the motherboard.

9. A parallel test board configured to perform test sequences by connecting a plurality of semiconductor devices under test (DUTs) to a motherboard, said motherboard configured to provide an actual operational environment for the DUTs, said parallel test board comprising:
   an intermediation board having conductive wiring patterns and configured to electrically interconnect the DUTs to the motherboard;
   a reference slot mounted to the intermediation board and configured to receive one or more of the DUTs, wherein said reference slot is electrically connected to the motherboard;
   an extension slot mounted to the intermediation board and configured to receive one or more of the DUTs, wherein said extension slot is electrically connected to the motherboard;
   a plurality of parallel slots connected in parallel to the reference slot, wherein said parallel slots are mounted to the intermediation board and configured to receive one or more of the DUTs,
   wherein the reference slot, the extension slot, and the parallel slots each comprise a socket structure, said socket structure comprising a support block having contact pins arranged in the same configuration thereon.

10. The parallel test board of claim 9, wherein each of the contact pins includes a module contact part configured to contact to a tab of the DUTs and a board contact part configured to contact a conductive pattern of the intermediation board.

11. The parallel test board of claim 10, wherein a first elastic member is interposed between the module contact part and the support block, and wherein a second elastic member is interposed between the board contact part and the support block.

12. The parallel test board of claim 11, wherein the board contact part of the contact pin substantially wraps around the second elastic member.

13. The parallel test board of claim 9, wherein the slots are bolt-coupled to the intermediation board.

14. The parallel test board of claim 9, wherein the intermediation board comprises connectors configured to pin-connect the intermediation board to the motherboard.

15. The parallel test board of claim 9, wherein the socket structure further comprises a housing configured to receive the contact pins and the support block, wherein said housing is configured to receive one of the DUTs, and wherein the housing comprises separation handles protruding from ends thereof.

16. The parallel test board of claim 9, wherein the intermediation board comprises a multi-layered structure.

17. The parallel test board of claim 9, wherein the reference slot, the extension slot, and the parallel slots are arranged in parallel to each other on the intermediation board, and wherein the slots are arranged having an irregular spacing therebetween.

18. The parallel test board of claim 9, wherein the socket structure comprises a housing configured to receive the contact pins and the support block, wherein said housing comprises two vertical members and a horizontal member arranged in approximately an "H" shape, wherein said horizontal member comprises an opening, and wherein said opening is configured to receive one of the DUTs inserted into the slot.

19. The parallel test board of claim 9, wherein the socket structure comprises a housing configured to receive the contact pins and the support block, wherein said housing comprises two vertical members and a horizontal member arranged in approximately an 'H' shape, and wherein a supplemental block is interposed between the support block and the vertical member to enlarge the width of the socket structure.

20. The parallel test board of claim 9, wherein the socket structure comprises a housing configured to receive the contact pins and the support block, said housing comprising two vertical members and a horizontal member arranged in approximately an 'H' shape, and wherein the vertical members comprise lower sections arranged below the horizontal member that are thicker than upper sections located above the horizontal member to enlarge the width of the socket structure.

21. A method of testing a plurality of memory modules in parallel under actual operating conditions, said method comprising:

arranging a plurality of test slots on a test board;

arranging at least two test slots in electrical communication with a motherboard;

arranging at least one test slot in parallel with the at least two test slots in electrical communication with the motherboard.

22. The method of claim 21, wherein arranging at least two test slots in electrical communication with a motherboard comprises arranging a reference slot in electrical communication with the motherboard.

23. The method of claim 21, wherein arranging at least two test slots in electrical communication with a motherboard comprises arranging an extension slot in electrical communication with the motherboard.

24. The method of claim 21, wherein arranging at least one test slot in parallel with the at least two test slots in electrical communication with the motherboard comprises arranging a plurality of parallel test slots to communicate with the motherboard.

25. The method of claim 21, further comprising arranging the test slots on the test board such that they have an irregular spacing.

* * * * *

UNITED STATES PATENT AND TRADEMARK OFFICE
CERTIFICATE OF CORRECTION

PATENT NO.   : 6,762,615 B2
DATED        : July 13, 2004
INVENTOR(S)  : Lee et al.

It is certified that error appears in the above-identified patent and that said Letters Patent is hereby corrected as shown below:

Column 6,
Line 13, "effectively detected" should read -- effectively detected. --.

Column 10,
Line 50, "reference slot, wherein" should read -- reference slot and the extension slot, wherein --.

Signed and Sealed this

Twenty-ninth Day of March, 2005

JON W. DUDAS
*Director of the United States Patent and Trademark Office*